(12) United States Patent
Hiyama

(10) Patent No.: US 6,756,825 B2
(45) Date of Patent: Jun. 29, 2004

(54) POWER DEVICE DRIVING CIRCUIT

(75) Inventor: Kazuaki Hiyama, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/331,647

(22) Filed: Dec. 31, 2002

(65) Prior Publication Data

US 2004/0017227 A1 Jan. 29, 2004

(30) Foreign Application Priority Data

Jul. 24, 2002 (JP) ........................................ 2002-214813

(51) Int. Cl.[7] .............................................. H03K 3/00
(52) U.S. Cl. ........................ 327/108; 327/109; 327/100
(58) Field of Search ................................ 327/108, 109, 327/374, 170, 110, 111; 326/82, 83, 84, 85, 86, 87

(56) References Cited

U.S. PATENT DOCUMENTS

| | | | | |
|---|---|---|---|---|
| 5,233,329 A | * | 8/1993 | Lippmann et al. | ........... 340/438 |
| 5,686,854 A | * | 11/1997 | Smith | ........................ 327/374 |
| 5,689,407 A | * | 11/1997 | Marinus et al. | ................ 363/21 |
| 5,696,431 A | * | 12/1997 | Giannopoulos et al. | ...... 315/308 |
| 6,057,729 A | * | 5/2000 | Nomura | ....................... 327/592 |

FOREIGN PATENT DOCUMENTS

| JP | 8-126351 | 5/1996 |
|---|---|---|
| JP | 2596774 | 4/1999 |

* cited by examiner

Primary Examiner—Tuan T. Lam
Assistant Examiner—Hiep Nguyen
(74) Attorney, Agent, or Firm—Oblon, Spivak, McClelland, Maier & Neustadt, P.C.

(57) ABSTRACT

Low-side switching devices (1A, 1B) and high-side switching devices (2A, 2B) are insulated gate bipolar transistors, to which clamp diodes (3A, 3B, 4A, 4B) are connected in parallel, respectively. Driving circuits and protection circuits have power lines along two paths: a power line (A) connected to a ground line (G) through power by-pass capacitors (14A, 14B); and a power line (B) connected to the ground line (G) through power by-pass capacitors (15A, 15B). Resistors (16A, 16B) are provided on the power line (A) between a power source (13) and the driving circuits, respectively.

8 Claims, 7 Drawing Sheets

POWER DEVICE DRIVING CIRCUIT

BACKGROUND OF THE INVENTION

1. Field of the Invention

The present invention relates to driving circuits of an inverter, and more particularly, to prevention of malfunctions of driving circuits of low-side switching devices.

2. Description of the Background Art

Figure 6:
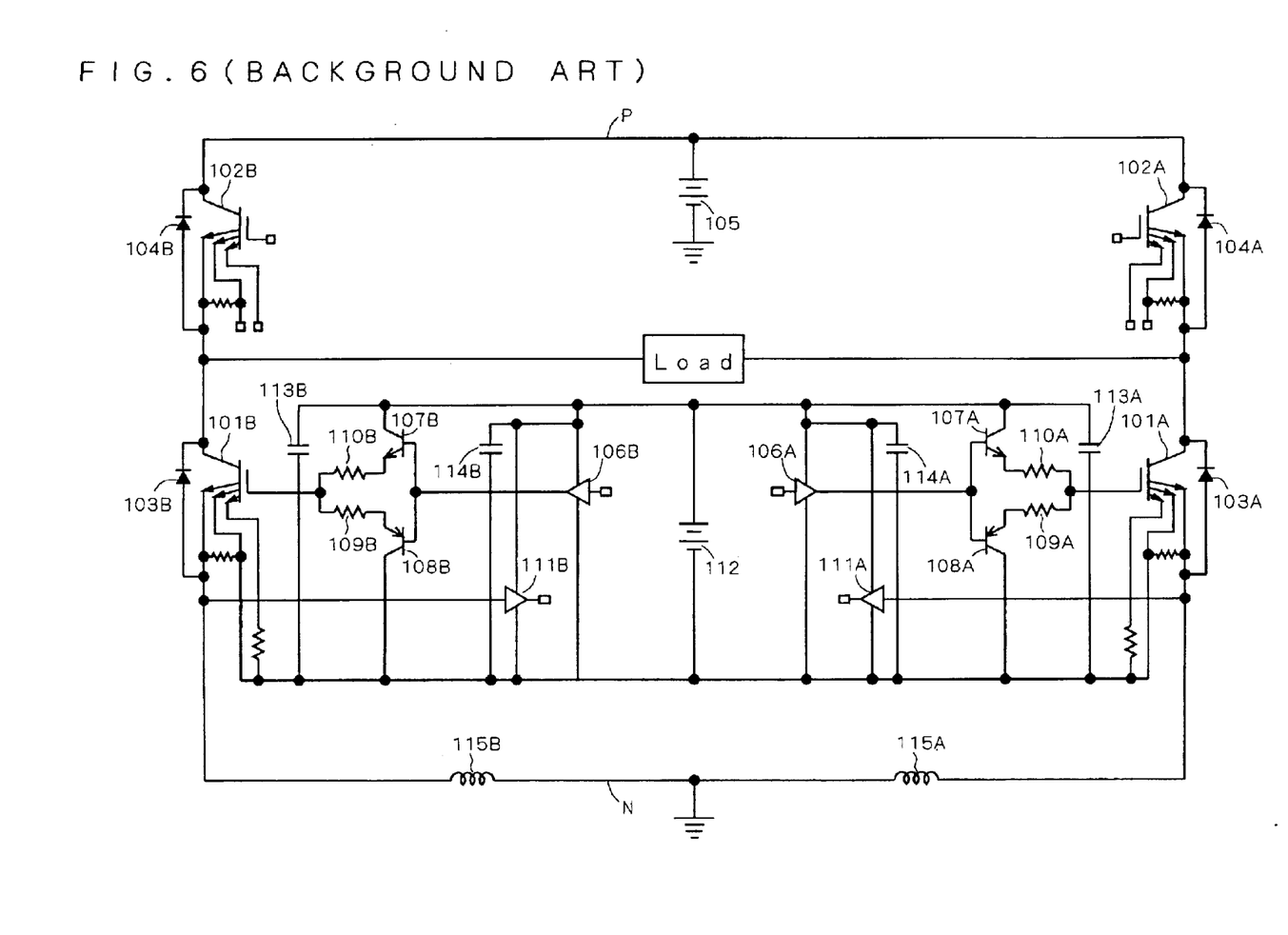
FIGS. 6 and 7 are circuit diagrams each showing a single-phase inverter according to the background art.

FIG. 6 is a circuit diagram showing a conventional single-phase inverter. Here, driving circuits and protection circuits of low-side switching devices 101A and 101B are illustrated, whereas those of high-side switching devices 102A and 102B are not illustrated.

The low-side switching devices 101A, 101B and high-side switching devices 102A, 102B are IGBTs (insulated gate bipolar transistors), to which diodes 103A, 103B, 104A and 104B are connected in parallel, respectively.

The emitter terminals of the low-side switching devices 101A and 101B are both grounded through an N bus (N), while the source terminals of the high-side switching devices 102A and 102B are both connected to a power source 105 through a P bus (P). The source terminals of the low-side switching devices 101A and 101B and the emitter terminals of the high-side switching devices 102A and 102B are all connected to a load.

Next, the low-side switching devices 101A and 101B are each connected to a driving circuit and a protection circuit. The driving circuits are formed by input buffers 106A, 106B and emitter follower circuits 107A, 107B, 108A and 108B. Control signals to the respective switching devices 101A and 101B are amplified in voltage at the input buffers 106A and 106B, respectively, and are supplemented in current driving capability at the emitter follower circuits 107A, 108A and at 107B, 108B, respectively, to be inputted to the base terminals of the low-side switching devices 101A and 101B, respectively. Resistors 109A and 109B are provided between the emitter follower circuit 108A and the base terminal of the low-side switching device 101A, and between the emitter follower circuit 108B and the base terminal of the low-side switching device 101B, respectively, while resistors 110A and 110B are provided between the emitter follower circuit 107A and the base terminal of the low-side switching device 101A, and between the emitter follower circuit 107B and the base terminal of the low-side switching device 101B, respectively.

The protection circuits are formed by input buffers 111A, 111B and resistors. The driving circuits and protection circuits connected to these low-side switching devices 101A and 101B are all connected to a common power source 112. A ground line of the driving circuits and protection circuits is connected to the emitter terminals of the low-side switching devices 101A and 101B. Thus, the N bus (N) and ground line of the driving circuits and protection circuits form an electric loop through the emitter terminals of the low-side switching devices 101A and 101B. Further, a power line of the driving circuits and protection circuits is connected to the ground line through power by-pass capacitors 113A, 113B, 114A and 114B.

The emitter terminals of the low-side switching devices 101A and 101B are each connected to the N bus (N). On this N bus (N), self-inductances 115A and 115B are present. Thus, switching of the low-side switching devices 101A and 101B changes the amount of current running through the N bus (N), causing a surge voltage to occur. The surge voltage changes the potential of the ground line of the driving circuits and protection circuits which form the electric loop, and also changes the voltage of the power line of the driving circuits and protection circuits connected through the power by-pass capacitors 113A, 113B, 114A and 114B. This causes the driving circuits and protection circuits to malfunction.

In the case where the driving circuits and protection circuits connected to the switching devices of the inverter are connected to the common power source 112 and the ground line of the driving circuits and protection circuits and the N bus (N) form an electric loop as described above, the occurrence of a surge voltage due to the self-inductances present on the N bus (N) causes variations in the voltage of the ground line and power line of the driving circuits and protection circuits, causing the driving circuits and protection circuits to malfunction.

Figure 7:
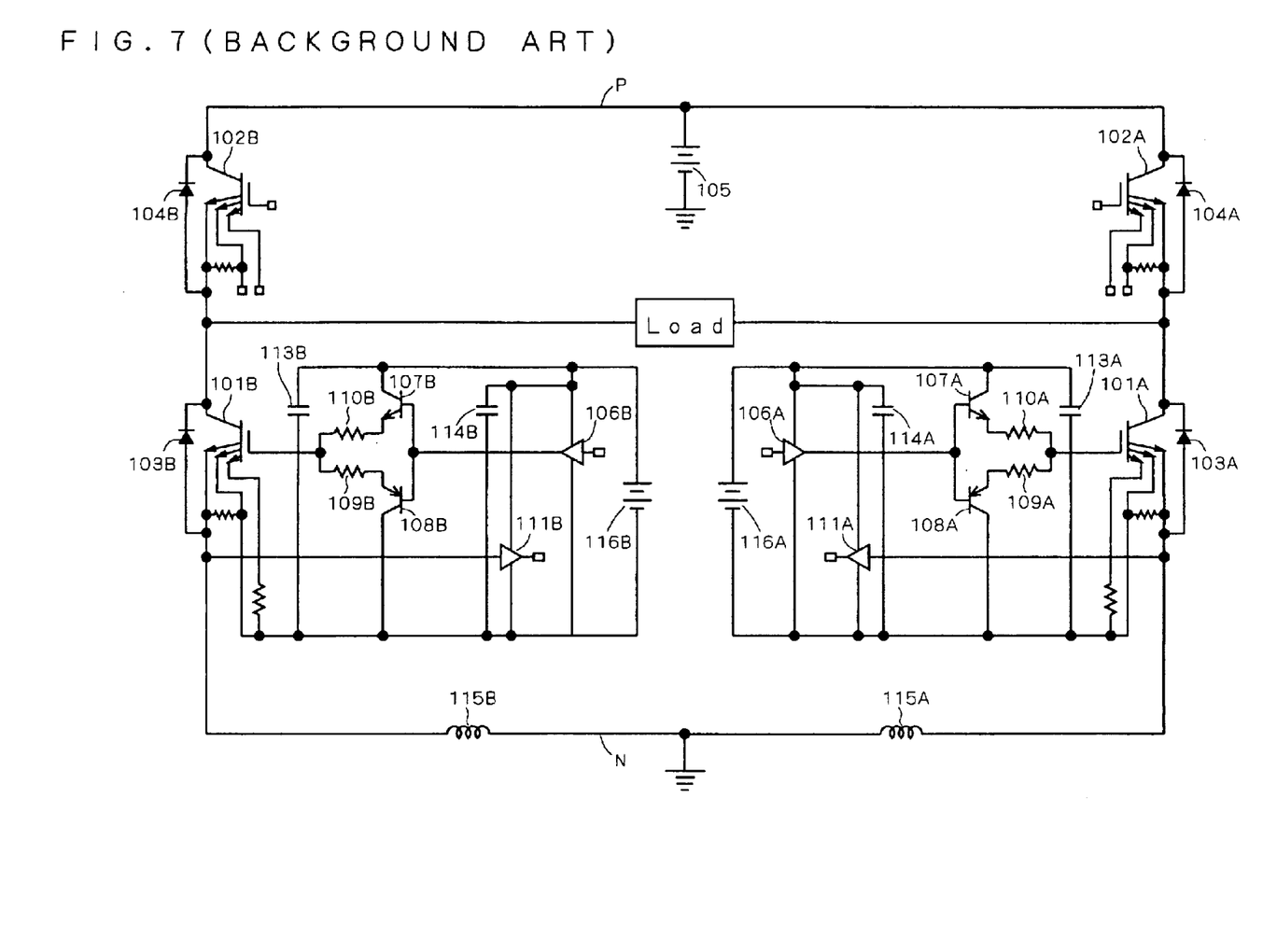

Conventionally, there has been a method of providing a power source for each of driving circuits and protection circuits of low-side switching devices in order to solve the aforementioned drawbacks. FIG. 7 is a circuit diagram showing a single-phase inverter in which driving circuits and protection circuits are each provided with a power source. The low-side switching devices 101A, 101B, high-side switching devices 102A, 102B, driving circuits and protection circuits shown in FIG. 7 have the same configuration as those shown in FIG. 6.

The driving circuit and protection circuit of the low-side switching device 101A are connected to a power source 116A, while those of the low-side switching device 101B are connected to a power source 116B. This is the difference from the configuration shown in FIG. 6. With the configuration shown in FIG. 7, the ground line of the driving circuits and protection circuits and N bus (N) do not form an electric loop. Thus, a surge voltage as generated does not change the voltages of the ground line and power line of the driving circuits and protection circuits, preventing the driving circuits and protection circuits from malfunctioning.

With the configuration shown in FIG. 7, however, the low-side switching devices and high-side switching devices each require a power source. For instance, a three-phase inverter requires six low-side switching devices and high-side switching devices in total, thus requiring six power sources in total. Therefore, drawbacks arise such as cost increase due to provision of additional power sources, upsizing of power sources and increase in interconnection between power sources, driving circuits and protection circuits.

SUMMARY OF THE INVENTION

An object of the present invention is to provide an inverter driving circuit capable of preventing a malfunction due to a surge voltage without upsizing circuits or increasing costs.

According to the present invention, a power device driving circuit includes a plurality of low-side switching devices, a plurality of driving circuits, a power source, an interconnect wire and a first resistor. The plurality of low-side switching devices form an inverter circuit, each having one terminal connected to a load and the other terminal connected to a common low-potential line. The plurality of driving circuits are configured to drive the plurality of low-side switching devices, respectively. The plurality of driving circuits are commonly connected to the power source. The interconnect wire is configured to connect the plurality of driving circuits and the power source, and to form an electric loop with the low-potential line through the plurality of low-side switching devices. The first resistor is provided on the interconnect wire between the plurality of driving circuits and the power source.

Since the power device driving circuit includes the resistor on the interconnect wire between the plurality of driving circuits and the power source, a surge current is unlikely to run through the interconnect wire, which can prevent the driving circuits and protection circuits from malfunctioning.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the present invention will be specifically described referring to the accompanying drawings showing preferred embodiments of the present invention.

First Preferred Embodiment

Figure 1:
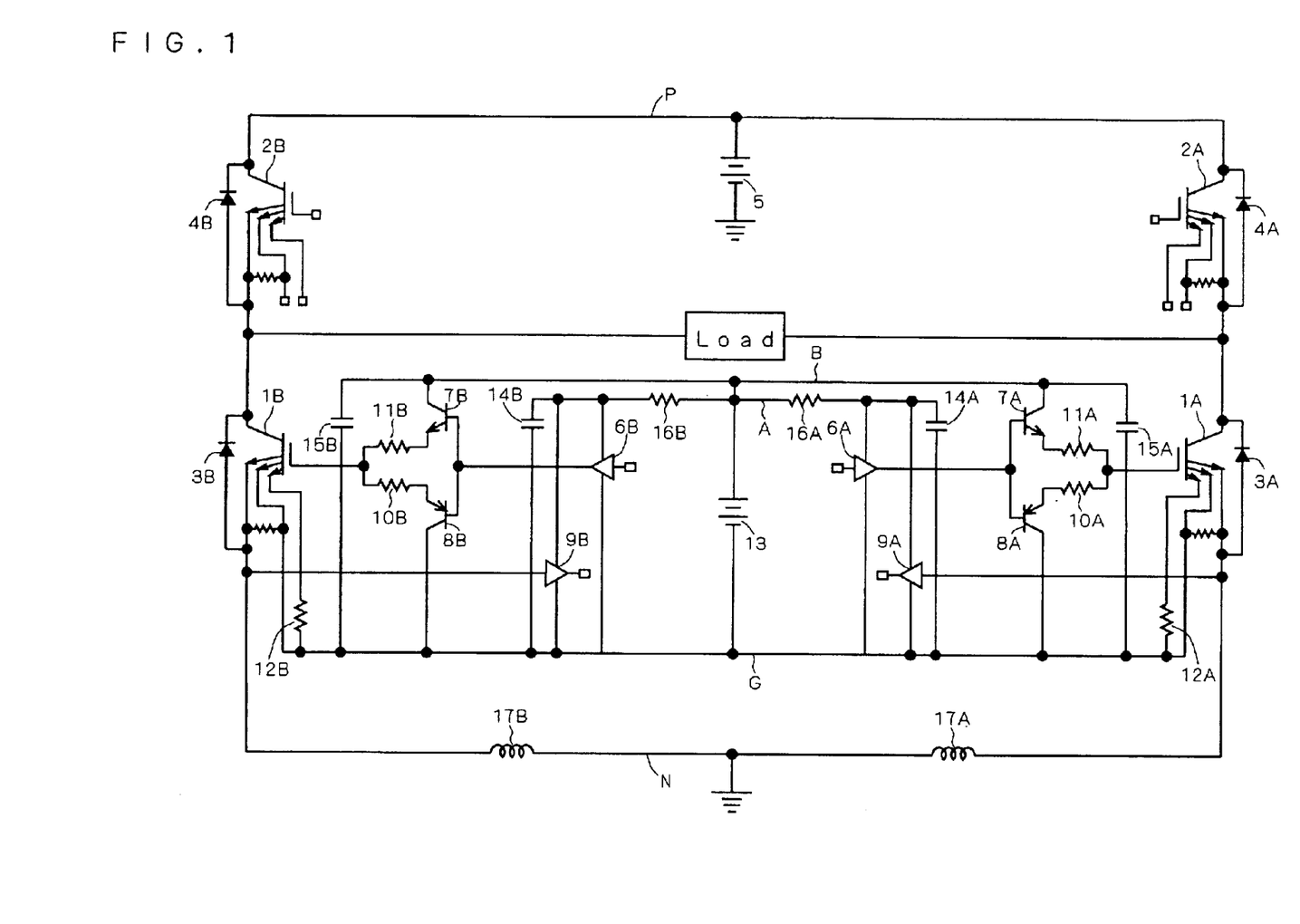
FIG. 1 is a circuit diagram showing a single-phase inverter according to a first preferred embodiment of the present invention.

FIG. 1 is a circuit diagram showing a single-phase inverter according to the present embodiment. Here, driving circuits and protection circuits of low-side switching devices 1A and 1B are illustrated, whereas those of high-side switching devices 2A and 2B are not illustrated.

The low-side switching devices 1A, 1B and high-side switching devices 2A, 2B are IGBTs (insulated gate bipolar transistors), to which diodes 3A, 3B, 4A and 4B are connected in parallel, respectively.

The emitter terminals of the low-side switching devices 1A and 1B are both grounded through the N bus low-potential line (N), while the source terminals of the high-side switching devices 2A and 2B are both connected to a power source 5 through the P bus (P). The source terminals of the low-side switching devices 1A and 1B and the emitter terminals of the high-side switching devices 2A and 2B are all connected to a load.

Next, the low-side switching devices 1A and 1B are each connected to a driving circuit and a protection circuit. The driving circuits are formed by input buffers 6A, 6B and emitter follower circuits 7A, 7B, 8A and 8B. Control signals to the respective switching devices 1A and 1B are amplified in voltage at the input buffers 6A and 6B, respectively, and are supplemented in current driving capability at the emitter follower circuits 7A, 8A and at 7B, 8B, respectively, to be inputted to the base terminals of the low-side switching devices 1A and 1B, respectively.

The emitter follower circuits 7A, 7B, 8A and 8B are divided into ON-side emitter follower transistors 7A, 7B and OFF-side emitter follower transistors 8A, 8B. The ON-side emitter follower transistors 7A and 7B have their base terminals connected to the input buffers 6A and 6B serving as input sections, respectively, their collector terminals both connected to a power source 13, and their emitter terminals connected to the low-side switching devices 1A and 1B, respectively. On the other hand, the OFF-side emitter follower transistors 8A and 8B have their base terminals and emitter terminals connected to the base terminals and emitter terminals of the ON-side emitter follower transistors 7A and 7B, respectively, and their collector terminals both connected to a ground line G (or first low-potential interconnect wire) of the driving circuits and protection circuits. OFF-side gate resistors 10A and 10B are provided between the emitter follower circuit 8A and the base terminal of the low-side switching device 1A, and between the emitter follower circuit 8B and the base terminal of the low-side switching device 1B, respectively, while ON-side resistors 11A and 11B are provided between the emitter follower circuit 7A and the base terminal of the low-side switching device 1A, and an ON-side gate resistor 11B is provided between the emitter follower circuit 7B and the base terminal of the low-side switching device 1B, respectively.

The protection circuits are formed by input buffers 9A, 9B and resistors 12A, 12B. The driving circuits and protection circuits connected to these low-side switching devices 1A and 1B are all connected to the common power source 13. The ground line G of the driving circuits and protection circuits is connected to the emitter terminals of the low-side switching devices 1A and 1B. Thus, the N bus (N) and ground line G form an electric loop through the emitter terminals of the low-side switching devices 1A and 1B.

The driving circuits and protection circuits have power lines along two paths: a power line A (or first high-potential interconnect wire) connected to the ground line G through power by-pass capacitors 14A and 14B; and a power line B (or second high-potential interconnect wire) connected to the ground line G through power by-pass capacitors 15A and 15B. The emitter follower circuits 7A, 7B, 8A and 8B are connected to the power line B, while the input buffers 6A, 6B, 9A and 9B are connected to the power line A. In the present embodiment, resistors 16A and 16B are further provided on the power line A between the power source 13 and the driving circuits.

Since self-inductances 17A and 17B are present on the N bus (N), switching of the low-side switching devices 1A and 1B changes the amount of current running through the N bus (N), causing a surge voltage to occur. The surge voltage changes the potential of the ground line G which forms the electric loop with the N bus (N). Here, the power lines A and B are connected to the ground line G through the power by-pass capacitors 14A, 14B and 15A, 15B, respectively. Thus, the surge voltage also changes the potentials of the power lines A and B.

In the present embodiment, however, the resistors 16A and 16B are provided on the power line A, so that a surge current resulting from a surge voltage is unlikely to run through the power line A as compared to the other paths, i.e., the power line B and ground line G. This is because, when current runs through a plurality of paths, the amount of current running through each path is inversely proportional to the impedance of each path.

That the surge current is unlikely to run through the power line A stabilizes the power line A in potential. The stabilization of the power line A can prevent the input buffers 6A, 6B, 9A and 9B connected thereto from malfunctioning. Therefore, the configuration shown in FIG. 1 can prevent malfunctions of the driving circuits and protection circuits due to the surge voltage resulting from variations in the amount of current running through the N bus (N).

Although the switching devices have been described as IGBTs, the present invention is not limited as such, but the switching devices may be thyristors or MOSFETs that perform similar functions as IGBTs. Further, the driving circuits and protection circuits according to the present invention are not limited as described above, but may be circuits that perform similar functions. For instance, the emitter follower circuits may be replaced with source follower circuits of MOSFETs or common emitters of bipolar circuits.

Second Preferred Embodiment

Figure 2:
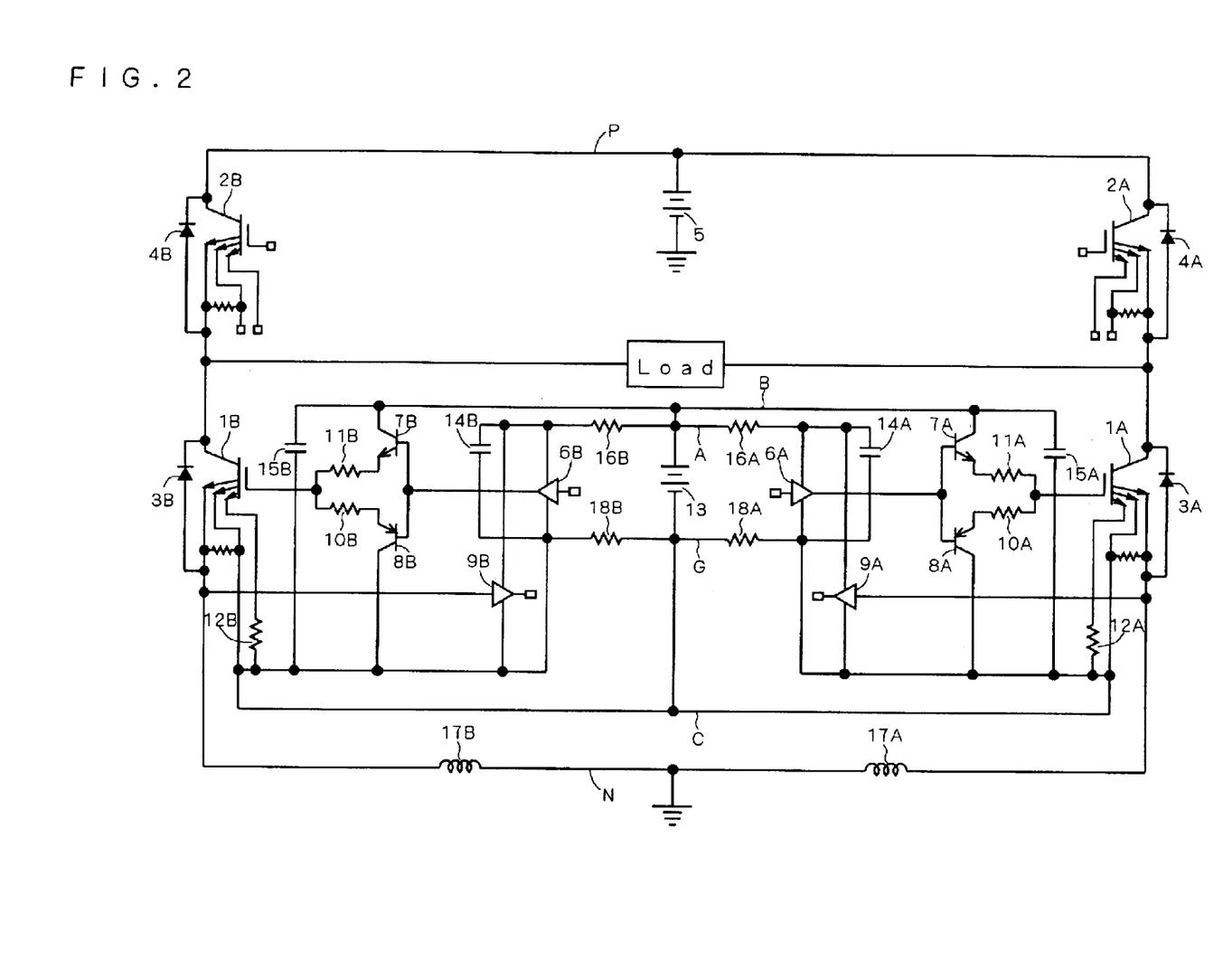
FIG. 2 is a circuit diagram showing a single-phase inverter according to a second preferred embodiment of the present invention.

FIG. 2 is a circuit diagram showing a single-phase inverter according to the present embodiment. Here, driving circuits and protection circuits of the low-side switching devices 1A and 1B are illustrated, whereas those of the high-side switching devices 2A and 2B are not illustrated.

The low-side switching devices 1A, 1B, high-side switching devices 2A, 2B, driving circuits and protection circuits shown in FIG. 2 are basically the same in configuration as those shown in FIG. 1, and detailed explanation thereof is thus omitted here.

In the present embodiment, resistors 18A and 18B are provided on the ground line G of the driving circuits and protection circuits between the power source 13 and driving circuits, respectively. Similarly to the first preferred embodiment, the resistors 16A and 16B are provided on the power line A between the power source 13 and driving circuits, respectively. In FIG. 2, a path C (or second low-potential interconnect wire) is additionally provided to which the respective emitter terminals of the low-side switching devices 1A and 1B, and further, the power source 13 are connected.

A surge voltage generated on the N bus (N) changes the potentials of the ground line G and path C which form the electric loop with the N bus (N). Here, the power lines A and B are connected to the ground line G through the power by-pass capacitors 14A, 14B and 15A, 15B, respectively. Thus, the surge voltage also changes the potentials of the power lines A and B.

In the present embodiment, however, the resistors 16A and 16B are provided on the power line A and the resistors 18A and 18B are provided on the ground line G, so that a surge current resulting from a surge voltage is unlikely to run through the power line A as compared to the other paths, i.e., the power line B and path C.

That the surge current is unlikely to run through the power line A and ground line G stabilizes the power line A and ground line G in potential. The stabilization of the power line A and ground line G can prevent the input buffers 6A, 6B, 9A and 9B connected to the power line A and the emitter follower circuits 7A, 7B, 8A and 8B connected to the ground line G from malfunctioning. Therefore, the configuration shown in FIG. 2 can prevent malfunctions of the driving circuits and protection circuits due to the surge voltage resulting from variations in the amount of current running through the N bus (N).

For instance, current, which is approximately one thousandth to one millionth of current passing through the emitter terminals connected to the N bus (N), passes through one of the emitter terminals of the low-side switching device 1A that is connected to the resistor 12A and one of those of the low-side switching device 1B that is connected to the resistor 12B. The resistors 12A and 12B detect current passing through the emitter terminals connected to the resistors 12A and 12B, respectively, to estimate current passing through the emitter terminals connected to the N bus (N). The reason why the resistors 12A and 12B detect current is to cause the input buffers 9A and 9B serving as the protection circuits to operate when a defect such as load shorting occurs and excessive current passes through the emitter terminals connected to the N bus (N). Generally, the protection circuits perform their protecting function when the voltage drop of the resistors 12A and 12B exceeds 0.5V.

Here, self-inductances (not shown) are also present on the ground line G of the driving circuits and protection circuits. Such self-inductances cause a voltage drop when a surge current runs through the ground line G. When variations in the potential of the ground line G resulting from this voltage drop cause the voltage drop of the resistors 12A and 12B to exceed 0.5V, causing the protection circuits to malfunction, stopping the low-side switching devices 1A and 1B. Provision of the resistors 18A and 18B on the ground line G as described in the present embodiment can prevent the above-mentioned malfunctions of the protection circuits.

Although the switching devices have been described as IGBTs, the present invention is not limited as such, but the switching devices may be thyristors or MOSFETs that perform similar functions as IGBTs. Further, the driving circuits and protection circuits according to the present invention are not limited as described above, but may be circuits that perform similar functions. For instance, the emitter follower circuits may be replaced with source follower circuits of MOSFETs or common emitters of bipolar circuits.

Third Preferred Embodiment

Figure 3:
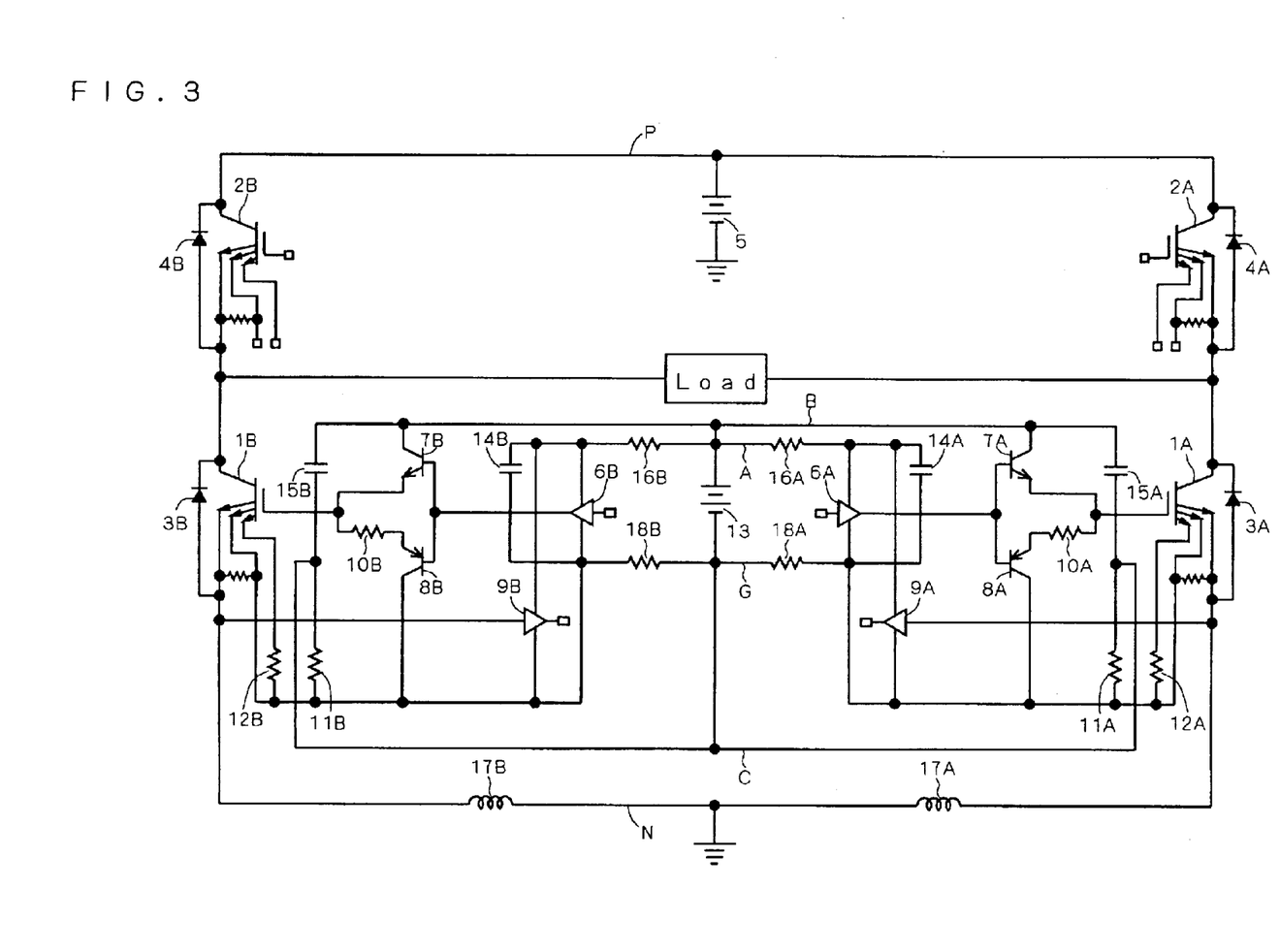
FIG. 3 is a circuit diagram showing a single-phase inverter according to a third preferred embodiment of the present invention.

FIG. 3 is a circuit diagram showing a single-phase inverter according to the present embodiment. Here, driving circuits and protection circuits of the low-side switching devices 1A and 1B are illustrated, whereas those of the high-side switching devices 2A and 2B are not illustrated.

The low-side switching devices 1A, 1B, high-side switching devices 2A, 2B, driving circuits and protection circuits shown in FIG. 3 are basically the same in configuration as those shown in FIG. 1, and detailed explanation thereof is thus omitted here.

In the present embodiment, the ON-side gate resistors 11A and 11B provided between the emitter terminal of the emitter follower circuit 7A and the base terminal of the low-side switching device 1A, and between the emitter terminal of the emitter follower circuit 7B and the base terminal of the low-side switching device 1B, respectively, in the second preferred embodiment are moved to locate between the ground line G and power by-pass capacitors 15A and 15B, respectively. Similarly to the second preferred embodiment, the resistors 18A and 18B are provided on the ground line G, and the resistors 16A and 16B are provided on the power line A. The path C described in the second preferred embodiment is so changed as to pass through the ON-side gate resistors 11A and 11B.

A surge voltage generated on the N bus (N) changes the potentials of the ground line G and path C which form the electric loop with the N bus (N). Here, the power lines A and B are connected to the ground line G through the power by-pass capacitors 14A, 14B and 15A, 15B, respectively. Thus, the surge voltage also changes the potentials of the power lines A and B.

In the present embodiment, however, the resistors 16A and 16B are provided on the power line A, and the resistors 18A and 18B are provided on the ground line G, and the ON-side gate resistors 11A and 11B are provided on the power line B and path C. Thus, a surge current resulting from a surge voltage is unlikely to runs through these paths.

That the surge current is unlikely to run through the power lines A, B, path C and ground line G stabilizes these paths in potential. The stabilization of these paths in potential can prevent the input buffers 6A, 6B, 9A and 9B and the emitter follower circuits 7A, 7B, 8A and 8B connected to these paths from malfunctioning. Therefore, the configuration shown in FIG. 3 can prevent malfunctions of the driving circuits and protection circuits due to the surge voltage resulting from variations in the amount of current running through the N bus (N).

The influence on malfunctions of the driving circuits and protection circuits resulting from voltage variations of the power line A and ground line G is great as compared to the power line B and path C. Thus, it is preferable to set the resistors 16A, 16B, 18A and 18B to have higher resistance values than the ON-side gate resistors 11A and 11B.

Further, in the present embodiment, locating the ON-side gate resistors 11A and 11B between the ground line G and power by-pass capacitors 15A and 15B, respectively, in order to reduce power loss and maintain switching properties of the low-side switching devices 1A and 1B prevents malfunctions of the driving circuits and protection circuits due to a surge voltage. However, the present invention is not limited as such, but may be achieved by providing another resistor between the ground line G and each of the power by-pass capacitors 15A and 15B without changing the position of the ON-side gate resistors 11A and 11B or providing a resistor at a position on each of the power line A and ground line G.

Although the switching devices have been described as IGBTs, the present invention is not limited as such, but the switching devices may be thyristors or MOSFETs that perform similar functions as IGBTs. Further, the driving circuits and protection circuits according to the present invention are not limited as described above, but may be circuits that perform similar functions. For instance, the emitter follower circuits may be replaced with source follower circuits of MOSFETs or common emitters of bipolar circuits.

Fourth Preferred Embodiment

Figure 4:
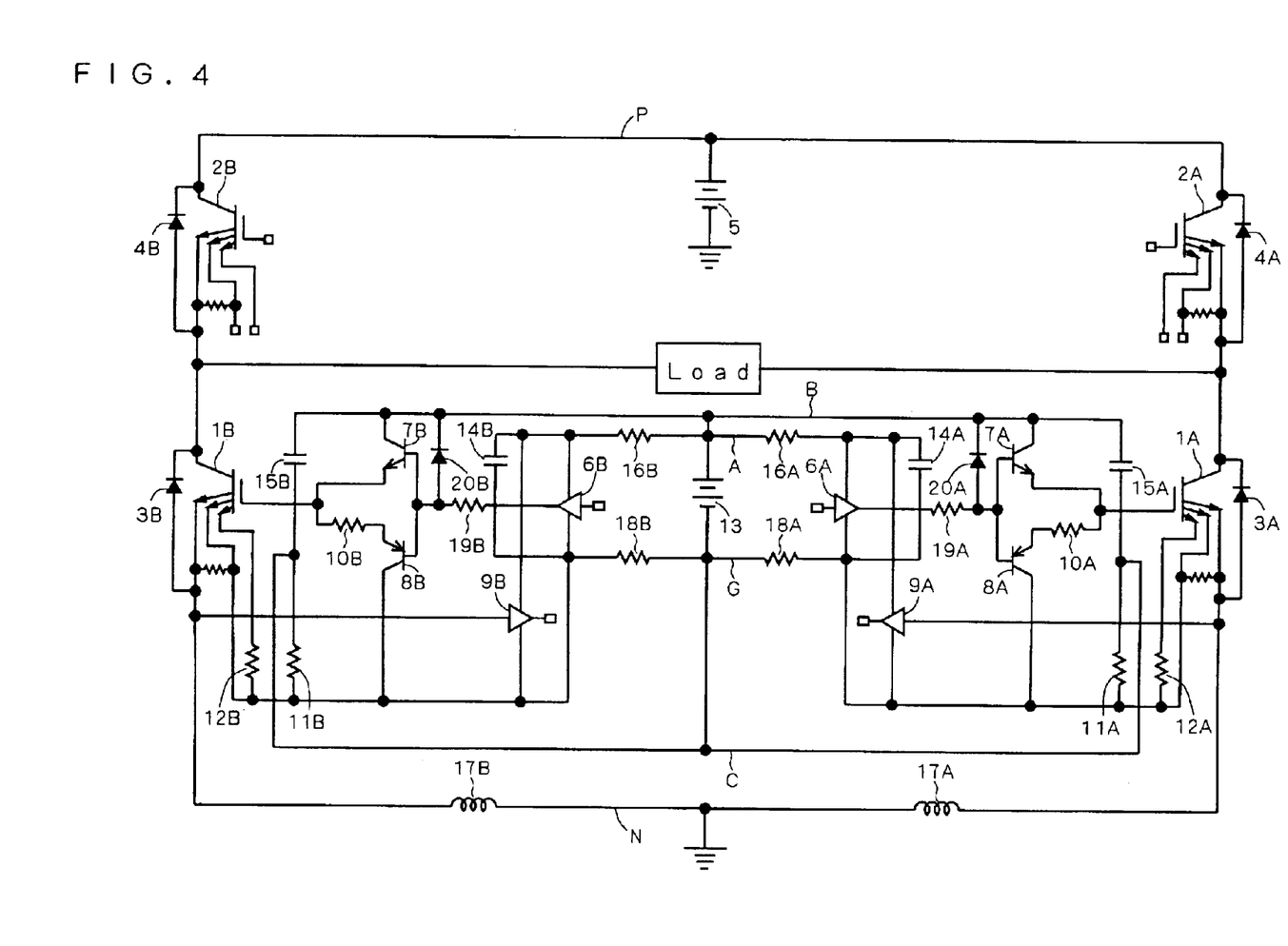
FIGS. 4 and 5 are circuit diagrams each showing a single-phase inverter according to a fourth preferred embodiment of the present invention.

FIG. 4 is a circuit diagram showing a single-phase inverter according to the present embodiment. Here, driving circuits and protection circuits of the low-side switching devices 1A and 1B are illustrated, whereas those of the high-side switching devices 2A and 2B are not illustrated.

The low-side switching devices 1A, 1B, high-side switching devices 2A, 2B, driving circuits and protection circuits shown in FIG. 4 are basically the same in configuration as those shown in FIG. 1, and detailed explanation thereof is thus omitted here.

In the present embodiment, resistors 19A and 19B are provided between the input buffer 6A and the base terminal of the emitter follower transistor 7A of the emitter follower circuit, and between the input buffer 6B and the base terminal of the emitter follower transistor 7B of the emitter follower circuit, respectively. Further, clamp diodes 20A and 20B are provided which connect the power line B and the emitter terminals of the ON-side emitter follower transistors 7A and 7B, respectively. The forward direction at these clamp diodes 20A and 20B is directed to the power line B from the base terminals of the ON-side emitter follower transistors 7A and 7B, respectively.

Similarly to the third preferred embodiment, the ON-side gate resistors 11A and 11B are located between the ground line G and the power by-pass capacitors 15A, 15B, respectively. The resistors 18A and 18B are provided on the ground line G, and the resistors 16A and 16B are provided on the power line A. The path C described in the second preferred embodiment is so changed as to pass through the ON-side gate resistors 11A and 11B.

A surge voltage generated on the N bus (N) changes the potentials of the ground line G and path C which form the electric loop with the N bus (N). Here, the power lines A and B are connected to the ground line G through the power by-pass capacitors 14A, 14B and 15A, 15B, respectively. Thus, the surge voltage also changes the potentials of the power lines A and B.

A surge current resulting from the occurrence of the surge voltage passes through the ON-side gate resistors 11A and 11B, causing voltage drops at the ON-side gate resistors 11A and 11B. When voltages resulting from the voltage drops at the ON-side gate resistors 11A and 11B are in the inverse direction of charging voltages of the power by-pass capacitors 14A, 15A and 15B, 14B, respectively, collector voltages of the emitter follower circuits 7A, 8A and 7B, 8B may be lower than output voltages from the input buffers 6A and 6B, respectively. At this time, an excessive current might pass through the base terminals of the emitter follower circuits 7A, 7B, 8A and 8B, causing the breakdown of the emitter follower circuits 7A, 7B, 8A and 8B.

Therefore, in the present embodiment, the resistors 19A and 19B are provided between the input buffer 6A and the base terminal of the emitter follower circuits 7A and 8A, and between the input buffer 6B and the base terminal of the emitter follower circuits 7B and 8B, respectively. The clamp diodes 20A and 20B are provided between the input buffer 6A and collector terminal of the emitter follower circuit 7A, and between the input buffer 6B and collector terminal of the emitter follower circuit 7B, respectively. Thus, an excessive current is prevented from passing through the base terminals of the emitter follower circuits 7A, 7B, 8A and 8B, which thus prevents the breakdown of the emitter follower circuits 7A, 7B, 8A and 8B. Since the configuration similar to that of the third preferred embodiment is included, it is possible to prevent malfunctions of the driving circuits and protection circuits due to the surge voltage resulting from variations in the amount of current running through the N bus (N).

Although the switching devices have been described as IGBTs, the present invention is not limited as such, but the switching devices may be thyristors or MOSFETs that perform similar functions as IGBTs. Further, in the present embodiment, locating the ON-side gate resistors 11A and 11B between the ground line G and power by-pass capacitors 15A and 15B, respectively, in order to reduce power loss and maintain switching properties of the low-side switching devices prevents malfunctions of the driving circuits and protection circuits due to the surge voltage. However, the present invention is not limited as such, but may be achieved by providing another resistor between the ground line G and each of the power by-pass capacitors 15A and 15B without changing the position of the ON-side gate resistors 11A and 11B.

Fifth Preferred Embodiment

Figure 5:
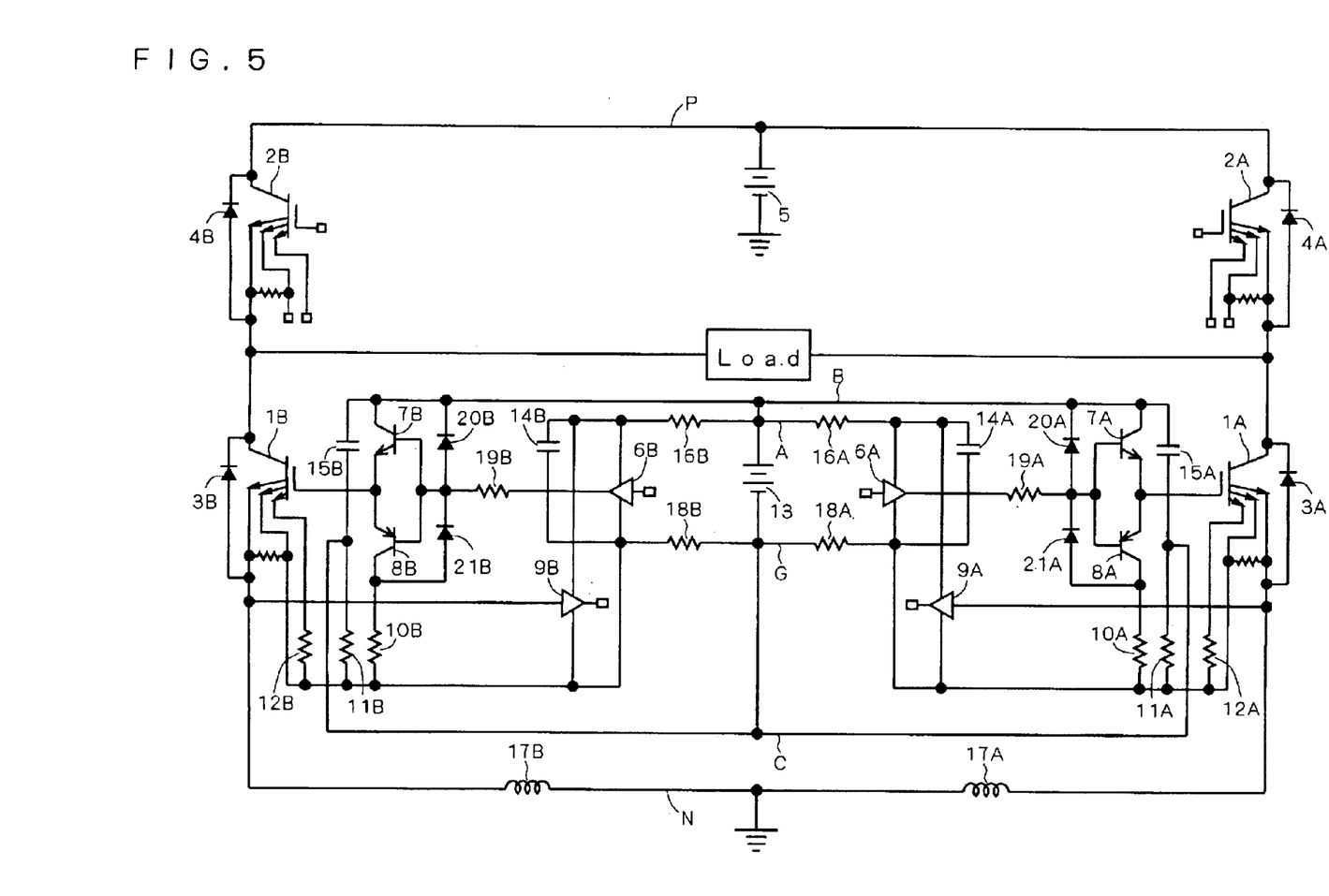

FIG. 5 is a circuit diagram showing a single-phase inverter according to the present embodiment. Here, driving circuits and protection circuits of the low-side switching devices 1A and 1B are illustrated, whereas those of the high-side switching devices 2A and 2B are not illustrated.

The low-side switching devices 1A, 1B, high-side switching devices 2A, 2B, driving circuits and protection circuits shown in FIG. 4 are basically the same in configuration as those shown in FIG. 1, and detailed explanation thereof is thus omitted here.

In the present embodiment, a clamp diode 21A connecting the base terminal of the ON-side emitter follower transistor 7A and the collector terminal of the OFF-side emitter follower transistor 8A, and a clamp diode 21B connecting the base terminal of the ON-side emitter follower transistor 7B and the collector terminal of the OFF-side emitter follower transistor 8B are provided. The forward direction at the clamp diodes 21A and 21B is directed toward the base terminals of the ON-side emitter follower transistors 7A and 7B from the collector terminals of the OFF-side emitter follower transistors 8A and 8B, respectively. Further, the OFF-side gate resistors 10A and 10B provided between the emitter terminal of the OFF-side emitter follower transistor 8A and the base terminal of the low-side switching device 1A, and between the emitter terminal of the OFF-side emitter follower transistor 8B and the base terminal of the low-side switching device 1B, respectively, are moved to locate between the ground line G and the collector terminals of the OFF-side emitter follower transistors 8A and 8B, respectively.

As in the fourth preferred embodiment, the resistors 19A and 19B are provided between the input buffer 6A and the base terminal of the ON-side emitter follower transistor 7A, and between the input buffer 6B and the base terminal of the ON-side emitter follower transistor 7B, respectively. Further, the clamp diodes 20A and 20B are provided which connect the power line B and the base terminals of the ON-side emitter follower transistors 7A and 7B, respectively. The forward direction at these clamp diodes 20A and 20B is directed to the power line B from the base terminals of the ON-side emitter follower transistors 7A and 7B, respectively.

Further, the ON-side gate resistors 11A and 11B are moved to locate between the ground line G and the power by-pass capacitors 15A and 15B, respectively. The resistors 18A and 18B are provided on the ground line G, and the resistors 16A and 16B are provided on the power line A. The path C described in the second preferred embodiment is changed such that the emitter terminals of the low-side switching devices 1A and 1B are connected to each other through the ON-side gate resistors 11A and 11B, respectively.

A surge voltage generated on the N bus (N) changes the potentials of the ground line G and path C which form the electric loop with the N bus (N). Here, the power lines A and B are connected to the ground line G through the power by-pass capacitors 14A, 14B and 15A, 15B, respectively. Thus, the surge voltage also changes the potentials of the power lines A and B.

A surge current resulting from the occurrence of the surge voltage passes through the ON-side gate resistors 11A and 11B, causing voltage drops at the ON-side gate resistors 11A and 11B. When voltages resulting from the voltage drops at the ON-side gate resistors 11A and 11B are in the inverse direction of charging voltages of the power by-pass capacitors 14A, 15A and 15B, 14B, respectively, and when the value of the voltage drops is greater than that of the charging voltages, the emitter follower circuits 7A, 7B, 8A and 8B may be brought into a reverse-connected state, resulting in breakdown.

Therefore, provision of the clamp diodes 21A and 21B in the present embodiment allows the clamp diodes 20A, 20B, 21A and 21B to conduct when the value of the voltage drops is greater than that of the charging voltages, which can prevent the emitter follower circuits 7A, 7B, 8A and 8B from being brought into a reverse-connected state. Further, changing the position of the OFF-side gate resistors 10A and 10B can limit the amount of current passing through the clamp diodes 20A, 20B, 21A and 21B. Accordingly, the present embodiment prevents the breakdown of the emitter follower circuits 7A, 7B, 8A and 8B by changing the position of the OFF-side gate resistors 10A and 10B and providing the clamp diodes 21A and 21B. Since the configuration similar to that of the third preferred embodiment is included, it is possible to prevent malfunctions of the driving circuits and protection circuits due to the surge voltage resulting from variations in the amount of current running through the N bus (N).

Although the switching devices have been described as IGBTs, the present invention is not limited as such, but the switching devices may be thyristors or MOSFETs that perform similar functions as IGBTs. Further, in the present embodiment, locating the ON-side gate resistors 11A and 11B between the ground line G and power by-pass capacitors 15A and 15B, respectively, in order to reduce power loss and maintain switching properties of the low-side switching devices prevents malfunctions of the driving circuits and protection circuits due to a surge voltage. However, the present invention is not limited as such, but may be achieved by providing another resistor between the ground line G and each of the collector terminals of the OFF-side emitter follower transistors 8A and 8B without changing the position of the OFF-side gate resistors 10A and 10B.

While the invention has been shown and described in detail, the foregoing description is in all aspects illustrative and not restrictive. It is therefore understood that numerous modifications and variations can be devised without departing from the scope of the invention.

What is claimed is:

1. A power device driving circuit comprising:
   a plurality of low-side switching devices forming an inverter circuit, each having one terminal connected to a load and another terminal connected to a low-potential line which is common to the low-side switching devices;
   a plurality of driving circuits configured to drive said plurality of low-side switching devices, respectively;
   a power source connected to said plurality of driving circuits;
   interconnect wiring configured to connect said plurality of driving circuits and said power source, so that said interconnect wiring is electrically connected with said low-potential line, said interconnect wiring including a first high potential interconnect wire connected to a high potential terminal of the power source and a second high potential interconnect wire connected to the high potential terminal of the power source; and
   first resistors respectively provided on said interconnect wiring between each of said plurality of driving circuits and said power source such that surge currents from the power source are diverted to the second high potential interconnect wire.

2. The power device driving circuit according to claim 1, wherein
   said interconnect wiring includes a first low-potential interconnect wire connected to a low potential terminal of the power source, and
   said first resistors are respectively provided on said first high-potential interconnect wire between each of said plurality of driving circuits and said power source.

3. The power device driving circuit according to claim 2, further comprising:
   other first resistors respectively provided on said first low-potential interconnect wire between each of said plurality of driving circuits and said power source.

4. The power device driving circuit according to claim 3, wherein said interconnect wiring further includes a second low-potential interconnect wire, said power device driving circuit further comprising
second resistors respectively connected in series between each of said plurality of low-side switching devices and nodes connecting said second high-potential interconnect wire and said second low-potential interconnect wire.

5. The power device driving circuit according to claim 4, wherein
each of said plurality of low-side switching devices does not have an ON-side resistor.

6. The power device driving circuit according to claim 5, wherein
said plurality of driving circuits each include a first circuit having an ON-side transistor and an OFF-side transistor, said power device driving circuit further comprising:
third resistors respectively connected to an input section of each said first circuit; and
first diodes respectively configured to clamp between a base and a collector of each said ON-side transistor.

7. The power device driving circuit according to claim 6, further comprising
second diodes respectively configured to clamp between a base and a collector of each said OFF-side transistor.

8. The power device driving circuit according to claim 7, further comprising
fourth resistors respectively provided between each of said collectors of said OFF-side transistors and said first low-potential interconnect wire, wherein
each of said plurality of low-side switching devices does not have an OFF-side resistor.

* * * * *